US012682912B2

(12) United States Patent
Jacoby et al.

(10) Patent No.: US 12,682,912 B2
(45) Date of Patent: Jul. 14, 2026

(54) PSEUDO REAL-TIME CONTENT-AWARE AUDITORY CLEANSING

(71) Applicant: Antares Audio Strategies, LLC, Santa Cruz, CA (US)

(72) Inventors: Christopher Jacoby, Oakland, CA (US); Andrew Kimpel, Los Gatos, CA (US)

(73) Assignee: Antares Audio Strategies, LLC, Santa Cruz, CA (US)

( * ) Notice: Subject to any disclaimer, the term of this patent is extended or adjusted under 35 U.S.C. 154(b) by 184 days.

(21) Appl. No.: 18/377,868

(22) Filed: Oct. 9, 2023

(65) Prior Publication Data

US 2025/0118324 A1 Apr. 10, 2025

(51) Int. Cl.
*G10L 21/0364* (2013.01)
*G10L 21/0264* (2013.01)
*G10L 25/30* (2013.01)
*G10L 25/60* (2013.01)
*H03G 5/16* (2006.01)

(52) U.S. Cl.
CPC ...... G10L 21/0364 (2013.01); G10L 21/0264 (2013.01); G10L 25/30 (2013.01); G10L 25/60 (2013.01); H03G 5/165 (2013.01)

(58) Field of Classification Search
CPC ........................... G10L 21/0364; G10L 25/60
See application file for complete search history.

(56) References Cited

U.S. PATENT DOCUMENTS 5,754,534 A * 5/1998 Nahumi ................ H04M 3/568
370/261

5,897,614 A * 4/1999 McKiel, Jr. ............. G10L 25/48
704/E11.002
6,373,953 B1 4/2002 Flaks
11,362,631 B2 6/2022 Crockett et al.
2009/0097674 A1* 4/2009 Watson ..................... B60R 1/12
381/86

(Continued)

FOREIGN PATENT DOCUMENTS

CA 1157953 A 11/1983
EP 3261089 B1 4/2019

OTHER PUBLICATIONS

Pramono, R. X. A., Bowyer, S., & Rodriguez-Villegas, E. (2017). Automatic adventitious respiratory sound analysis: A systematic review. PloS one, 12(5), e0177926.*

(Continued)

*Primary Examiner* — Bryan S Blankenagel
(74) *Attorney, Agent, or Firm* — Marton Ribera Schumann & Chang LLP; Chien-Ju Alice Chuang

(57) ABSTRACT

Techniques for pseudo real-time content-aware auditory cleansing are described herein. A method for pseudo real-time content-aware auditory cleansing may include introducing a delay in the delivery of an audio file by an audio delivery system, collecting a sample of the audio file, predicting the presence of a sibilance and other unwanted sounds in the sample, cleansing the sample of the sibilance and other unwanted sounds, and outputting a cleansed version of the sample. The delay corresponds to a length of the sample. Cleansing the sample may include one or more of a gain reduction, an equalization adjustment, a replacement, and removal of the sibilance and other unwanted sounds.

18 Claims, 5 Drawing Sheets

(56) References Cited

U.S. PATENT DOCUMENTS

| | | | | |
|---|---|---|---|---|
| 2016/0165361 | A1* | 6/2016 | Miller | H04R 25/43 |
| | | | | 381/317 |
| 2016/0189707 | A1* | 6/2016 | Donjon | G10L 15/02 |
| | | | | 704/228 |
| 2017/0372719 | A1 | 12/2017 | Li et al. | |
| 2019/0014404 | A1* | 1/2019 | Olsson | H04R 1/1083 |
| 2022/0369031 | A1 | 11/2022 | Lester et al. | |
| 2023/0410824 | A1* | 12/2023 | Zhang | G10L 21/0364 |

OTHER PUBLICATIONS

Anjos, I., Grilo, M., Ascensão, M., Guimarães, I., Magalhães, J., & Cavaco, S. (Nov. 2018). A model for sibilant distortion detection in children. In Proceedings of the 2018 international conference on digital medicine and image processing (pp. 42-47).*
Extended European Search Report received in European Application No. 24205193.6 mailed Jan. 8, 2025.
Rane Commercial Audio Products, "Dynamics Processors—Technology & Applications," Sep. 2005, pp. 1-39.
Sound on Sound, "Techniques For Vocal De-essing," May 2009, pp. 1-6.

\* cited by examiner

500

PSEUDO REAL-TIME CONTENT-AWARE AUDITORY CLEANSING

BACKGROUND OF INVENTION

In speech and singing, sibilant sounds, such as "s," "sh," and "t" occur frequently, and depending on the microphone and processing chain used, can often be perceived as significantly louder and harsher than the rest of the audio signal. These unwanted sounds often "pop" out of an audio or vocal track in an undesirable manner.

Conventional solutions include "de-essers." De-essers are typically implemented as multiband compressors, wherein compression is only performed on a relevant sibilant band, compressing only where sibilant frequencies occur in the signal. Unfortunately, they are simply frequency dependent and unaware of any further context in the signals, therefore they often compress non-sibilant sounds as well, resulting in undesirable compression (i.e., undesirable or unwanted removal of sounds, undesirable artifacts) in the program material (i.e., in parts of the audio signal other than sibilant sounds). FIG. 1 is a block diagram of an exemplary prior art feed-forward de-esser with a split-band parametric equalizer (i.e., a fixed band-pass or high-pass filter), a conventional gain computer, and conventional compressor. The feed-forward de-esser passes through signals above a threshold frequency or within a frequency range (e.g., 8-12 kHz, 4-12 kHz) associated with sibilant sounds.

When single de-essers handle different sibilant sounds differently, producers often use multiple de-essers in an attempt to solve their multiple sibilance problems, each narrowed in to a target specific sibilance in the signal. For example, a first de-esser might sound better on an "s" and a second de-esser might sound better on a "t." However, this leads to a complex and long signal chain.

Therefore, pseudo real-time content-aware auditory cleansing to improve compression of different sibilant sounds is desirable.

BRIEF SUMMARY

The present disclosure provides techniques for pseudo real-time content-aware auditory cleansing. A method for pseudo real-time auditory cleansing may include: introducing a look-ahead delay in delivering an audio file by an audio delivery system; collecting, by a buffer, a sample of the audio file, the sample having a length equal to the look-ahead delay; predicting, by machine learning-based phoneme classifier, a presence of a sibilance in the sample; cleansing the sample of the presence of the classified sibilance type; and outputting a cleansed version of the sample. In some examples, the sibilance comprises at least one of a classified sibilance type. In some examples, the cleansing of the sample comprises compressing the sample according to a gain control setting corresponding to the classified sibilance type, the gain control setting determined by a gain computer. In some examples, the gain control setting comprises a gain reduction. In some examples, the classified sibilance type comprises one of a sibilance classification set. In some examples, the sibilance classification set comprises {s, sh, t}. In some examples, the look-ahead delay and the length of the sample each are less than 15 seconds.

Another method for pseudo real-time content-aware auditory cleansing may include: introducing a look-ahead delay in delivering an audio file by an audio delivery system; collecting, by a buffer, a sample of the audio file, the sample having a length equal to the look-ahead delay; predicting, by a machine learning-based classifier, a presence of an unwanted sound in the sample; cleansing, by a functional module, the sample of the presence of the unwanted sound; and outputting a cleansed version of the sample. In some examples, the unwanted sound comprises at least one of a classified unwanted sound type. In some examples, the cleansing of the sample comprises compressing the sample according to a gain control setting corresponding to the classified unwanted sound type, the gain control setting determined by a gain computer. In some examples, the gain control setting comprises a gain reduction. In some examples, the cleansing of the sample comprises an equalization adjustment according to a control setting corresponding to the classified unwanted sound type. In some examples, the cleansing of the sample comprises removal of the presence of the unwanted sound. In some examples, the cleansing of the sample comprises replacement of the presence of the unwanted sound. In some examples, the unwanted sound comprises one, or a combination, of a sibilance sound, a plosive, a breath, and a non-speech sound artifact. In some examples, the look-ahead delay and the length of the sample each are less than 15 seconds. In some examples, the functional module comprises one, or a combination, of a gain computer, an equalizer module, and a sound replacement module.

A system for pseudo real-time content-aware auditory cleansing may include: a buffer configured to collect a sample of an audio file, the sample having a length equal to a delay being introduced in the delivery of the audio file; a sound classifier comprising configured to receive the sample and output a prediction of a presence of a classified unwanted sound type in the sample; and a functional module configured to cleanse the sample of the classified unwanted sound type, the functional module further configured to output a cleansed version of the sample. In some examples, the functional module comprises one, or a combination, of a gain computer, a compressor, an equalizer module, and a sound replacement module. In some examples, the audio file comprises a vocal track. In some examples, the functional module is configured to perform a control function configured to cause a cleansing action. In some examples, the cleansing action comprises one, or a combination, of a compression, an equalization adjustment, a replacement, and a removal of the unwanted sound.

BRIEF DESCRIPTION OF THE DRAWINGS

Various non-limiting and non-exhaustive aspects and features of the present disclosure are described hereinbelow with references to the drawings, wherein.

Figures 1, 2:
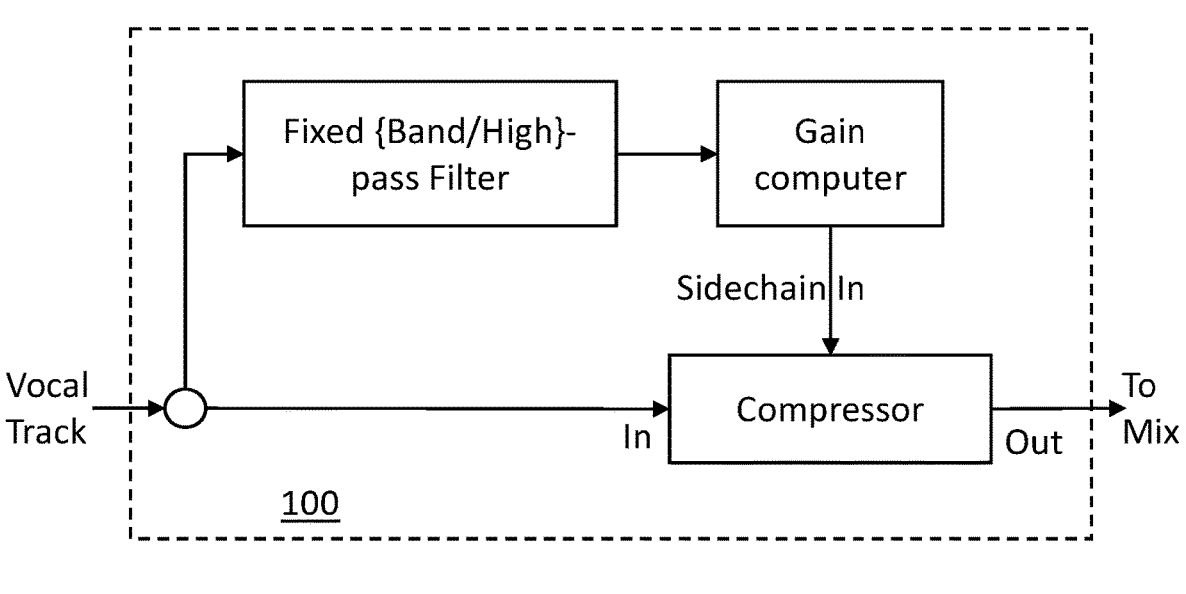
FIG. 1 is a block diagram of an exemplary prior art de-esser.
FIG. 2 is a simplified block diagram of an exemplary pseudo real-time content-aware auditory cleansing system, in accordance with one or more embodiments.

Like reference numbers and designations in the various drawings indicate like elements. Skilled artisans will appreciate that elements in the Figures are illustrated for simplicity and clarity, and have not necessarily been drawn to scale, for example, with the dimensions of some of the elements exaggerated relative to other elements to help to improve understanding of various embodiments. Common, well-understood elements that are useful or necessary in a commercially feasible embodiment are often not depicted in order to facilitate a less obstructed view of these various embodiments.

DETAILED DESCRIPTION

The invention is directed to a pseudo real-time content-aware auditory cleansing technique, which may be used for de-essing, as well as cleansing and/or replacing other unwanted sounds such as plosives, breaths, non-speech sound artifacts. A system for pseudo real-time content-aware auditory cleansing may comprise a pseudo real-time sibilant sound classifier, a buffer, and one or more functional modules. The pseudo real-time sibilant sound classifier may comprise a machine learning-based phoneme classifier configured to receive and analyze the content of a buffered input and generate a prediction (e.g., sibilance prediction, unwanted sound prediction) of a presence of a classified sibilance type, if any, in the buffered input (e.g., content, signal). The prediction may indicate the presence of one or more classified sibilance types in a given buffered input. A digital signal processing analysis also may be performed to determine a level of excessive sibilance.

A sidechain may be generated in an audio delivery system and routed to a buffer configured to collect samples of the same length as a given {n} ms "look-ahead" delay introduced into the audio delivery system. The buffered input may comprise a sample of {n} ms length (e.g., 2-8 ms, 8-15 ms, 15-20 ms, or other length of time that is largely imperceptible to a listener) of the audio file (e.g., an audio track, a vocal track, and the like). A length of buffered input (i.e., {n} ms) may be determined according to one or more parameters, such as settings on a digital converter, buffer size, sample rate, and more.

The one or more functional modules may comprise one, or a combination, of a gain computer, an equalizer module, a sound replacement module, and other modules configured to set controls to address different types of unwanted sounds in an audio file (e.g., an audio track, a vocal track, and the like). The one or more functional modules may be configured to mitigate (e.g., subtract, smooth, eliminate, replace, etc.) unwanted sounds in the audio file. In the example of a de-esser, separate gain controls for each of a plurality of possible "ess" sounds may be stored, for example to apply a different gain reduction. For example, where the pseudo real-time sibilant sound classifier is predicting a presence of a classified sibilance type from a sibilance classification set {s, sh, t}, a gain control from a corresponding gain control set {−6 dB, −9 dB, −3 dB} may be stored for use by a functional module (e.g., comprising a gain computer and a compressor) to mitigate a predicted sibilance. Therefore, if the pseudo real-time sibilant sound classifier predicts there to be an occurrence of a classified sibilance type present in a buffered input from the sibilance classification set, the gain computer may be configured to set a corresponding control function for compression or other mitigating function, comprising one or a combination of a gain reduction, an attack measure, a release measure, an equalization adjustment (i.e., change), removal, replacement, etc.

In some examples, a gain control set also may include gain reduction settings corresponding to an occurrence of one or more classified sibilance types in a buffered input. In other examples, a functional module (e.g., comprising a gain computer) may be configured to compute an appropriate gain reduction setting according to a given function when one or more types of classified sibilance types are predicted to be present in a buffered input. In still other examples, the functional module may be configured to take another action (i.e., cleansing action to mitigate, replace, and/or remove an unwanted sound) and/or two or more actions to address a predicted sibilance that may comprise two or more classified sibilance types.

FIG. 2 is a simplified block diagram of an exemplary pseudo real-time content-aware auditory cleansing system, in accordance with one or more embodiments. System 200 may comprise buffer 204, classifier 206, gain computer 208, and compressor 210. In some examples, a delay 212 (e.g., 2-8 ms, 8-15 ms, 15-20 ms, or other length of time that is largely imperceptible to a listener) may be introduced into system 200. The delay 212 may provide a short "look-ahead" for vocal track 202 (e.g., an audio file) so that sibilant sounds may be predicted and cleansed from vocal track 202 before being output (e.g., for mixing). In some examples, buffer 204 may be configured to collect samples of a given length from vocal track 202 in a sidechain. In some examples, the samples collected by buffer 204 may be the same length as delay 212. In some examples, classifier 206 may comprise a phoneme classifier configured to receive the samples collected by buffer 204 as input and predict a presence and a type of sibilance that is present, if any. For example, classifier 206 may be configured to output a sibilance prediction that indicates whether a buffered sample comprises a sibilant "s" sound, a sibilant "sh" sound, and/or a sibilant "t" sound. In some examples, classifier 206 may be configured to provide its sibilance prediction(s) to gain computer 208 (e.g., as gain {a} through gain {n}, as shown in FIG. 2).

In some examples, gain computer 208 may be configured to store or access separate gain controls for a plurality of possible sibilant sounds. In some examples, gain computer 208 also may be configured to select and/or apply an appropriate gain reduction for each of the plurality of possible sibilant sounds. For example, gain computer 208 may store or access active gain controls for the sibilance classification set {s, sh, t} and be configured to apply (e.g., cause compressor 210 to compress according to) one of the gain control (e.g., reduction and other modification) set {−6 dB, −9 dB, −3 dB} for each of the sibilance set. In some examples, gain computer 208 may be configured to set a gain reduction on compressor 210 according to the sibilance prediction from classifier 206. In some examples, a gain control set also may include gain control settings corresponding to an occurrence of two or more classified sibilance types in a buffered sample (e.g., select a gain reduction from the gain control set, select two gain reductions from the gain control set, fade between two or more gain reductions from the gain control set, determine another modified gain reduction that accounts for the two or more classified sibilance types). In some examples, gain computer 208 and compressor 210 may be implemented together (e.g., as a single module or computing unit).

Figure 3:
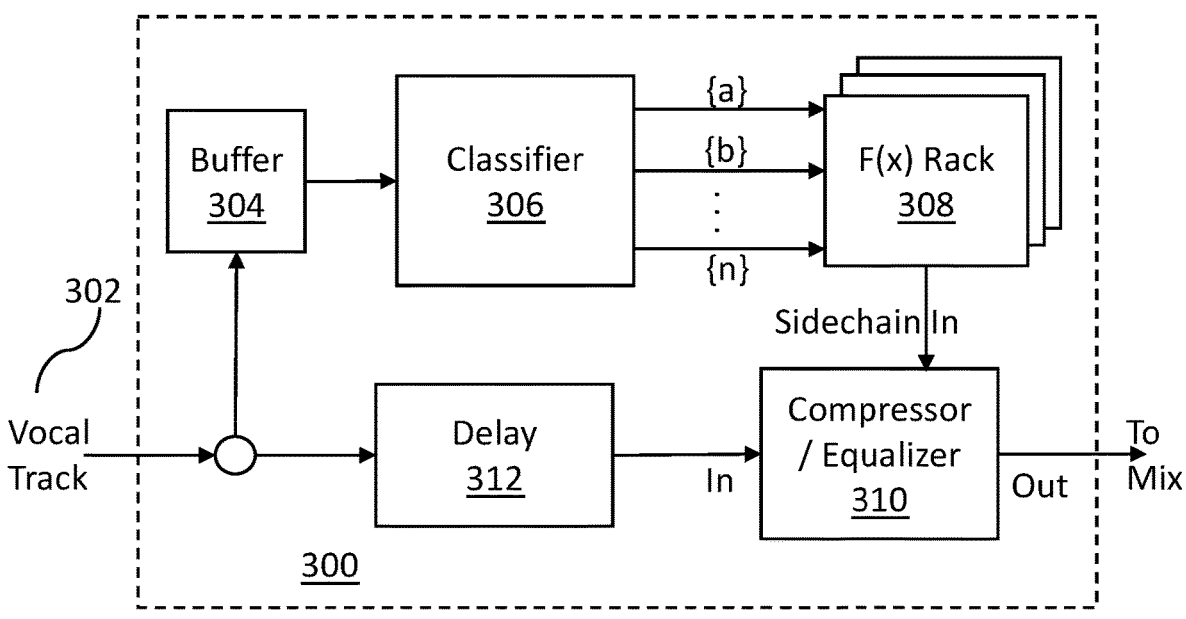
FIG. 3 is a simplified block diagram of an alternative pseudo real-time content-aware auditory cleansing system, in accordance with one or more embodiments.

FIG. 3 is a simplified block diagram of an alternative pseudo real-time content-aware auditory cleansing system, in accordance with one or more embodiments. System 300 may comprise buffer 304, classifier 306, functional module (i.e., F(x) rack) 308, and compressor/equalizer 310. In some examples, a delay 312 (e.g., similar to delay 212 in FIG. 2) may be introduced into system 300. The delay 312 may provide a short "look-ahead" for vocal track 302 so that sibilant sounds may be predicted and cleansed from vocal track 302 before being output (e.g., for mixing). In some examples, buffer 304 may be configured to collect samples of a given length from vocal track 302 in a sidechain. In some examples, the samples collected by buffer 304 may be the same length as delay 312. In some examples, classifier 306 may comprise a sound classifier configured to receive the samples collected by buffer 304 as input and predict a presence of a type of unwanted auditory sounds {a} and {b} through {n} (e.g., sibilance, plosives, breaths, non-speech sound artifacts, and the like) that is present, if any. For example, classifier 306 may be configured to output an unwanted sound prediction that indicates whether a buffered sample comprises one or more of a classified unwanted sound type (e.g., a high frequency sibilant sound, a low frequency plosive sound, an unwanted breath sound, and other unwanted sound artifacts). In some examples, classifier 306 may be configured to provide said unwanted sound prediction(s) to functional module 308.

In some examples, functional module 308 may comprise a set of functional controls (e.g., F(x) rack) for a plurality of possible unwanted auditory sound types (e.g., a classified unwanted sounds set). For example, functional module 308 may comprise one, or a combination, of a gain computer, an equalizer module, a sound replacement module, and other modules configured to determine and/or set controls to address different types of unwanted sounds in an audio file. In some examples, functional module 308 also may be configured to, or cause compressor/equalizer 310 to, apply an appropriate cleansing action (e.g., a compression according to a selected gain reduction, an equalization adjustment, a given attack and release action, and other actions to mitigate, replace, and/or remove an unwanted sound) for each of the plurality of possible unwanted auditory sounds. For example, functional module 308 may store or access gain controls, equalizer controls, and other auditory cleansing controls for an auditory sound classification set and be configured to apply one or more cleansing actions (e.g., a compression according to a selected gain reduction, an equalization adjustment, a given attack and release action, and the like) for each unwanted sound of the auditory sound classification set. In some examples, functional module 308 may be configured to set a gain reduction, an equalization action, and/or other action on compressor/equalizer 310 according to the unwanted sound prediction from classifier 306.

In some examples, an occurrence of two or more classified auditory sound types may be predicted in a buffered sample, and functional module 308 may be configured to set a modified cleansing action and/or two or more cleansing actions for compressor/equalizer 310 to take in order to address the two or more classified auditory sound types. In some examples, functional modules 308 and compressor/equalizer 310 may be implemented together (e.g., as a single module or computing unit). For example, compressor/equalizer 310 may be implemented as one of functional modules 308.

Figure 4A:
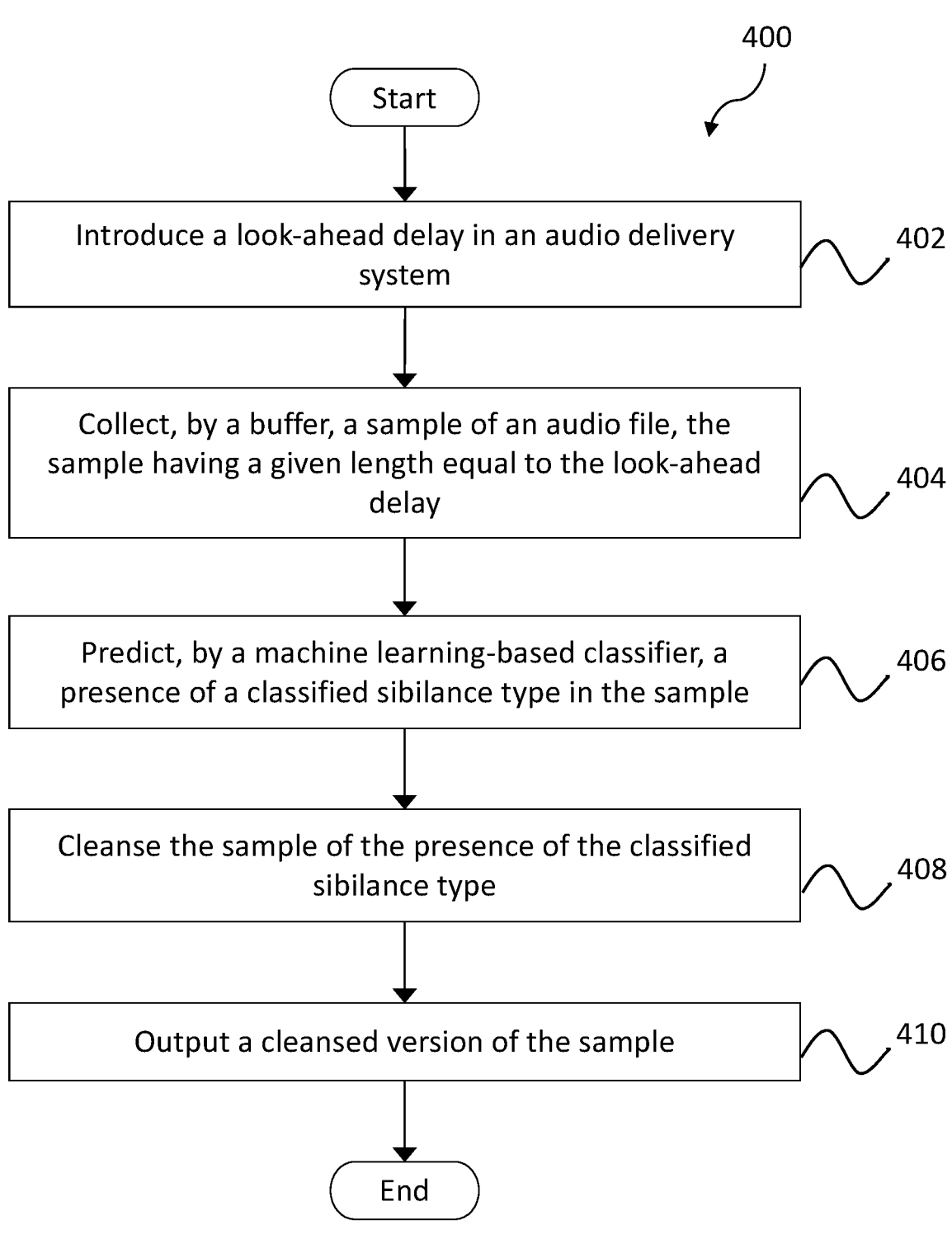
FIGS. 4A-4B are flow diagrams illustrating methods for pseudo real-time auditory cleansing, in accordance with one or more embodiments.
Figure 4B:
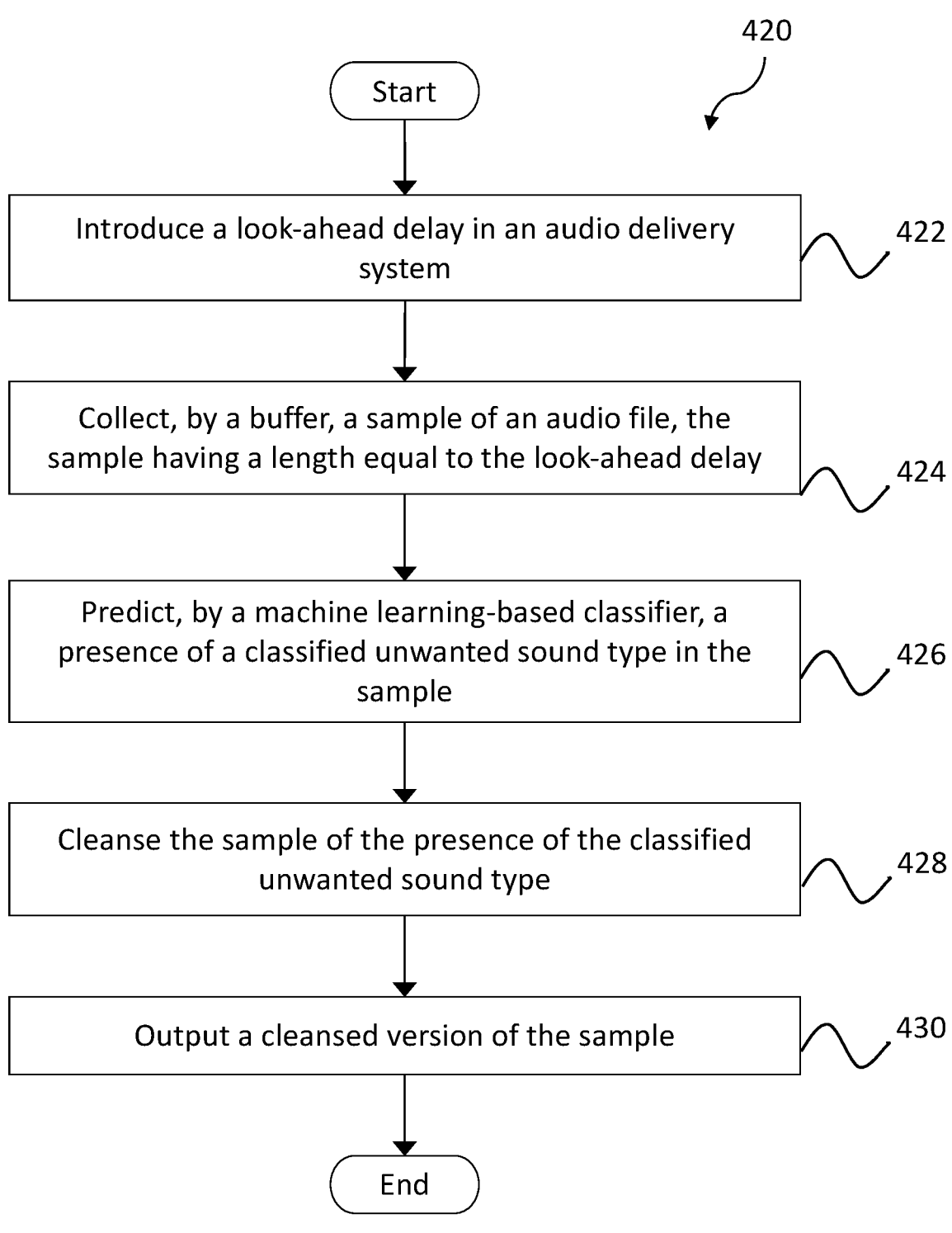

FIGS. 4A-4B are flow diagrams illustrating methods for pseudo real-time content-aware auditory cleansing, in accordance with one or more embodiments. In FIG. 4A, method 400 begins with introducing a look-ahead delay in an audio delivery system at step 402. A sample of an audio file may be collected by a buffer at step 404, the sample having a given length equal to the look-ahead delay. A presence of a classified sibilance type in the sample may be predicted by a classifier at step 406. In some examples, the classifier may comprise a machine learning-based phoneme classifier configured to predict the presence of a classified sibilance type or other type of unwanted sound in a sample of a vocal track and other audio files. As described herein, the classifier may be configured to receive the sample as input and to output a prediction indicating a presence of a classified sibilance type. The sample may be cleansed of the presence of the classified sibilance type at step 408. In some examples, this cleansing step may comprise setting a gain control and compressing according to the gain control setting, as described herein. A cleansed version of the sample may be output at step 410.

In some examples, the cleansed version of the sample may comprise one, or a combination, of a compressed sibilance sound, a compressed other unwanted sound, a replaced unwanted sound, a removed unwanted sound, an equalized unwanted sound, and another mitigated unwanted sound. In other examples, a presence of a different type of classified unwanted sound may be predicted, and cleansing the sample may comprise one, or a combination, of another gain control setting and compression, equalization adjustment, sound removal, sound replacement, and other auditory cleansing action that may be taken by a functional module, as described herein. In FIG. 4B, method 420 also begins with introducing a look-ahead delay in an audio delivery system at step 422, and collecting, by a buffer, a sample of an audio file at step 424, the sample having a length equal to the look-ahead delay. A presence of a classified unwanted sound type in the sample may be predicted at step 426 by a classifier. As described herein, the classifier may be machine learning-based. The sample may be cleansed of the presence of the classified unwanted sound type at step 428. Said cleansing step may comprise compression of a sibilance or other unwanted sound, replacement of an unwanted sound, removal of an unwanted sound, equalizing of an unwanted sound, and other mitigation and cleansing actions. As described herein, one or more functional modules may perform said cleansing step, including one, or a combination, of a gain computer, an equalizer module, a sound replacement module, and other modules configured to determine and/or set controls to address different types of unwanted sounds in an audio file. A cleansed version of the sample may be output at step 430.

Figure 5A:
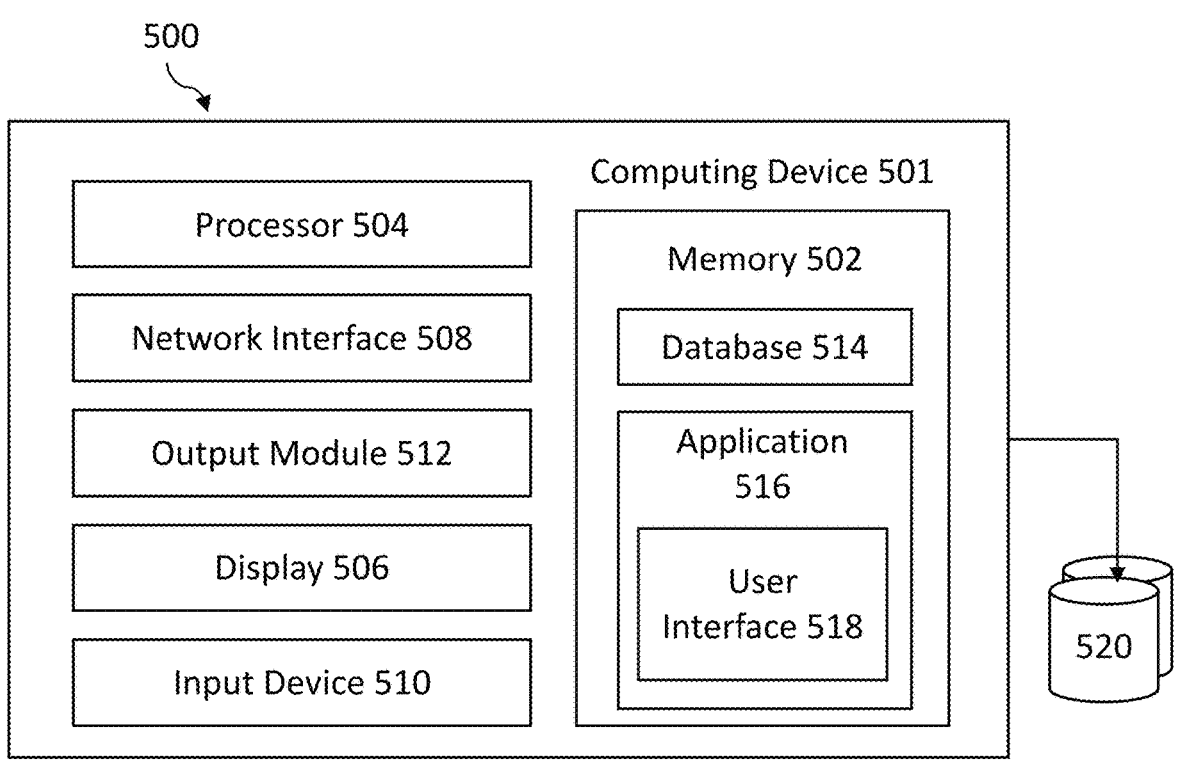
FIG. 5A is a simplified block diagram of an exemplary computing system configured to perform steps of the method illustrated in FIG. 4 and to implement the system illustrated in FIGS. 2 and 3, in accordance with one or more embodiments.

FIG. 5A is a simplified block diagram of an exemplary computing system configured to perform steps of the method illustrated in FIG. 4 and to implement the system illustrated in FIGS. 2 and 3, in accordance with one or more embodiments. In one embodiment, computing system 500 may include computing device 501 and storage system 520. Storage system 520 may comprise a plurality of repositories and/or other forms of data storage, and it also may be in communication with computing device 501. In another embodiment, storage system 520, which may comprise a plurality of repositories, may be housed in one or more of computing device 501. In some examples, storage system 520 may store audio data (e.g., vocal tracks, audio files, buffered samples, classified sibilance and other unwanted sound types, gain control settings), neural networks, other code, instructions, programs, and other various types of information as described herein. This information may be retrieved or otherwise accessed by one or more computing devices, such as computing device 501, in order to perform some or all of the features described herein. Storage system 520 may comprise any type of computer storage, such as a hard-drive, memory card, ROM, RAM, DVD, CD-ROM, write-capable, and read-only memories. In addition, storage system 520 may include a distributed storage system where data is stored on a plurality of different storage devices, which may be physically located at the same or different geographic locations (e.g., in a distributed computing system such as system 550 in FIG. 5B). Storage system 520 may be networked to computing device 501 directly using wired connections and/or wireless connections. Such network may include various configurations and protocols, including short range communication protocols such as Bluetooth™, Bluetooth™ LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

Computing device 501 also may include a memory 502. Memory 502 may comprise a storage system configured to store a database 514 and an application 516. Application 516 may include instructions which, when executed by a processor 504, cause computing device 501 to perform various steps and/or functions, as described herein. Application 516 further includes instructions for generating a user interface 518 (e.g., graphical user interface (GUI)). Database 514 may store various algorithms and/or data, including neural networks and data regarding audio data and machine learning-based classifiers, among other types of data. Memory 502 may include any non-transitory computer-readable storage medium for storing data and/or software that is executable by processor 504, and/or any other medium which may be used to store information that may be accessed by processor 504 to control the operation of computing device 501.

Computing device 501 may further include a display 506, a network interface 508, an input device 510, and/or an output module 512. Display 506 may be any display device by means of which computing device 501 may output and/or display data. Network interface 508 may be configured to connect to a network using any of the wired and wireless short range communication protocols described above, as well as a cellular data network, a satellite network, free space optical network and/or the Internet. Input device 510 may be a mouse, keyboard, touch screen, voice interface, and/or any or other hand-held controller or device or interface by means of which a user may interact with computing device 501. Output module 512 may be a bus, port, and/or other interface by means of which computing device 501 may connect to and/or output data to other devices and/or peripherals.

In one embodiment, computing device 501 is a data center or other control facility (e.g., configured to run a distributed computing system as described herein), and may communicate with a media playback device. As described herein, system 500, and particularly computing device 501, may be used for implementing efficient two-pass encoding, as described herein. Various configurations of system 500 are envisioned, and various steps and/or functions of the processes described herein may be shared among the various devices of system 500 or may be assigned to specific devices.

Figure 5B:
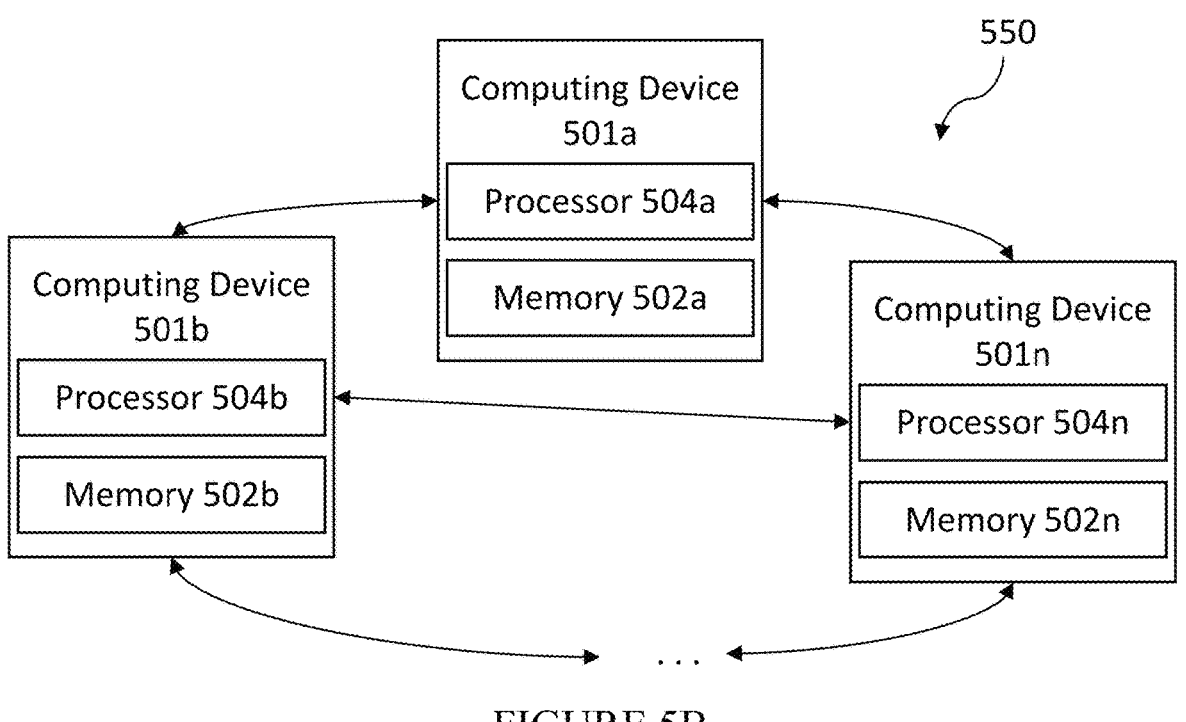
FIG. 5B is a simplified block diagram of an exemplary distributed computing system implemented by a plurality of the computing devices, in accordance with one or more embodiments.

FIG. 5B is a simplified block diagram of an exemplary distributed computing system implemented by a plurality of the computing devices, in accordance with one or more embodiments. System 550 may comprise two or more computing devices 501a-n. In some examples, each of 501a-n may comprise one or more of processors 504a-n, respectively, and one or more of memory 502a-n, respectively. Processors 504a-n may function similarly to processor 504 in FIG. 5A, as described above. Memory 502a-n may function similarly to memory 502 in FIG. 5A, as described above.

While specific examples have been provided above, it is understood that the present invention can be applied with a wide variety of inputs, thresholds, ranges, and other factors, depending on the application. For example, the time frames, rates, ratios, and ranges provided above are illustrative, but one of ordinary skill in the art would understand that these time frames and ranges may be varied or even be dynamic and variable, depending on the implementation.

As those skilled in the art will understand, a number of variations may be made in the disclosed embodiments, all without departing from the scope of the invention, which is defined solely by the appended claims. It should be noted that although the features and elements are described in particular combinations, each feature or element can be used alone without other features and elements or in various combinations with or without other features and elements. The methods or flow charts provided may be implemented in a computer program, software, or firmware tangibly embodied in a computer-readable storage medium for execution by a general-purpose computer or processor.

Examples of computer-readable storage mediums include a read only memory (ROM), random-access memory (RAM), a register, cache memory, semiconductor memory devices, magnetic media such as internal hard disks and removable disks, magneto-optical media, and optical media such as CD-ROM disks.

Suitable processors include, by way of example, a general-purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, or any combination of thereof.

What is claimed is:

1. A method for pseudo real-time content-aware auditory cleansing, the method comprising:

introducing a look-ahead delay in delivering an audio file by an audio delivery system, the look-ahead delay being a length of time that is largely imperceptible to a listener;

collecting, by a buffer in a sidechain, a sample of the audio file, the sample having a length equal to the look-ahead delay;

predicting, by machine learning-based phoneme classifier, a presence of a sibilance in the sample in real time, the machine learning-based phoneme classifier receiving the sample from the buffer and generating a classified sibilance type within a timeframe that is equal to or less than the look-ahead delay, the machine learning-based phoneme classifier being able to predict which type of sibilance from a sibilance classification set that includes {s, sh, t} is present and to output a prediction selected from the sibilance classification set as the classified sibilance type;

cleansing, in the sidechain, the sample of the presence of the classified sibilance type; and outputting a cleansed version of the sample.

2. The method of claim 1, wherein the cleansing the sample comprises compressing the sample according to a gain control setting corresponding to the classified sibilance type, the gain control setting determined by a gain computer.

3. The method of claim 2, wherein the gain control setting comprises a gain reduction.

4. The method of claim 1, wherein the look-ahead delay and the length of the sample each are less than 15 seconds.

5. A method for pseudo real-time content-aware auditory cleansing, the method comprising:

collecting, by a buffer in a sidechain, a sample of the audio file, the sample having a length equal to a look-ahead delay, the look-ahead delay being a length of time that is largely imperceptible to a listener;

predicting, by a machine learning-based classifier, a presence of an unwanted sound in the sample in real time, the machine learning-based classifier receiving the sample from the buffer and generating a classified unwanted sound type within a timeframe that is equal to or less than the look-ahead delay, the machine learning-based classifier being able to predict which type of unwanted sound from a classification set that includes {s, sh, t} is present and to output a prediction selected from the classification set as the classified unwanted sound type;

cleansing, by a functional module in the sidechain, the sample of the presence of the unwanted sound; and outputting a cleansed version of the sample.

6. The method of claim 5, wherein the cleansing the sample comprises compressing the sample according to a gain control setting corresponding to the classified unwanted sound type, the gain control setting determined by a gain computer.

7. The method of claim 6, wherein the gain control setting comprises a gain reduction.

8. The method of claim 5, wherein the cleansing the sample comprises an equalization adjustment according to a control setting corresponding to the classified unwanted sound type.

9. The method of claim 5, wherein the cleansing the sample comprises removal of the presence of the unwanted sound.

10. The method of claim 5, wherein the cleansing the sample comprises replacement of the presence of the unwanted sound.

11. The method of claim 5, wherein the unwanted sound comprises one, or a combination, of a sibilance sound, a plosive, a breath, and a non-speech sound artifact, the machine learning-based classifier able to determine whether the unwanted sound comprises the sibilance sound, the plosive, the breath, and the non-speech sound artifact.

12. The method of claim 5, wherein the look-ahead delay and the length of the sample each are less than 15 seconds.

13. The method of claim 5, wherein the functional module comprises one, or a combination, of a gain computer, an equalizer module, and a sound replacement module.

14. A system for pseudo real-time content-aware auditory cleansing, the system comprising:

a buffer configured to collect a sample of an audio file, the sample having a length equal to a delay being introduced in the delivery of the audio file, the delay comprising a length of time that is largely imperceptible to a listener;

a machine learning-based sound classifier comprising configured to receive the sample from the buffer in a sidechain and output a prediction of a presence of a classified unwanted sound type in the sample within a timeframe that is equal to or less than the look-ahead delay, the machine learning-based classifier able to determine whether the unwanted sound comprises one or more of a sibilance sound, a plosive, a breath, and a non-speech sound artifact, the machine learning-based sound classifier being able to predict which type of unwanted sound from a classification set that includes {s, sh, t} is present and to output a prediction selected from the classification set as the classified unwanted sound type; and a functional module configured to cleanse the sample of the classified unwanted sound type, the functional module further configured to output a cleansed version of the sample.

15. The system of claim 14, wherein the functional module comprises one, or a combination, of a gain computer, a compressor, an equalizer module, and a sound replacement module.

16. The system of claim 14, wherein the audio file comprises a vocal track.

17. The method of claim 14, wherein the functional module is configured to perform a control function configured to cause a cleansing action.

18. The method of claim 17, wherein the cleansing action comprises one, or a combination, of a compression, an equalization adjustment, a replacement, and a removal of the unwanted sound.

* * * * *